US012763803B2

(12) United States Patent
Yue

(10) Patent No.: US 12,763,803 B2
(45) Date of Patent: Oct. 13, 2026

(54) RADIO FREQUENCY PA MID DEVICE, RADIO FREQUENCY SYSTEMS, AND COMMUNICATION DEVICE

(71) Applicant: GUANGDONG OPPO MOBILE TELECOMMUNICATIONS CORP., LTD., Dongguan (CN)

(72) Inventor: Zhongbo Yue, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 384 days.

(21) Appl. No.: 18/359,575

(22) Filed: Jul. 26, 2023

(65) Prior Publication Data

US 2023/0370097 A1 Nov. 16, 2023

Related U.S. Application Data

(63) Continuation of application No. PCT/CN2021/135418, filed on Dec. 3, 2021.

(30) Foreign Application Priority Data

Jan. 29, 2021 (CN) ......................... 202110128961.0

(51) Int. Cl.
*H04B 1/00* (2006.01)
*H03F 1/02* (2006.01)
(Continued)

(52) U.S. Cl.
CPC ........... *H04B 1/0078* (2013.01); *H03F 3/245* (2013.01); *H03F 2200/451* (2013.01)

(58) Field of Classification Search
None
See application file for complete search history.

(56) References Cited

U.S. PATENT DOCUMENTS 8,472,917 B1 * 6/2013 Rahman ................. H04M 11/04 455/435.2
8,565,701 B2 * 10/2013 Sanchez ................. H04B 1/006 455/168.1
9,307,407 B1 * 4/2016 Feher ...................... H04W 4/80
10,027,287 B1 * 7/2018 Ichitsubo .................. H03F 3/72
(Continued)

FOREIGN PATENT DOCUMENTS

CN 101436866 A 5/2009
CN 103219948 A 7/2013
(Continued)

OTHER PUBLICATIONS

Chinese First Office Action and search report in the corresponding Chinese Patent Application No. 202110128961.0, mailed Dec. 2, 2021.
(Continued)

*Primary Examiner* — Pablo N Tran
(74) *Attorney, Agent, or Firm* — Ladas & Parry, LLP

(57) ABSTRACT

Provided are a RF PA Mid device, a RF system and a communication device. The RF PA Mid device is arranged with a first input port, a second input port and a first antenna port, and includes: a first switch unit configured to selectively output a high-frequency signal of a first model or an intermediate-frequency signal of a second mode; a plurality of first power amplifiers, each thereof being configured to support amplification processing of the high-frequency signal and the intermediate-frequency signal; and a first power combiner. A plurality of input ends of the first power combiner are respectively connected to output ends of the first power amplifiers in one-to-one correspondence, and an output end of the first power combiner is connected to the first antenna port, so as to combine output power of the first power amplifiers to output the intermediate-frequency signal or high-frequency signal with target power.

18 Claims, 7 Drawing Sheets

(51) Int. Cl.

| | |
|---|---|
| ***H03F 3/21*** | (2006.01) |
| ***H03F 3/24*** | (2006.01) |
| ***H04B 1/401*** | (2015.01) |

(56) References Cited

U.S. PATENT DOCUMENTS

| | | | | |
|---|---|---|---|---|
| 10,187,137 | B2 * | 1/2019 | Weissman | H04B 1/0483 |
| 2009/0128254 | A1 | 5/2009 | Goi et al. | |
| 2010/0277252 | A1 * | 11/2010 | Gorbachov | H03F 1/0261<br>333/104 |
| 2016/0036390 | A1 | 2/2016 | Lin et al. | |
| 2016/0164466 | A1 * | 6/2016 | Briffa | H03F 3/24<br>330/295 |
| 2016/0164474 | A1 * | 6/2016 | Beltran Lizarraga | H03F 3/24<br>330/275 |
| 2016/0248392 | A1 * | 8/2016 | Laighton | H03F 3/602 |
| 2019/0165738 | A1 * | 5/2019 | Pan | H03F 3/604 |
| 2025/0183846 | A1 * | 6/2025 | Lehtola | H03F 3/211 |

FOREIGN PATENT DOCUMENTS

| | | | |
|---|---|---|---|
| CN | 104753555 | A | 7/2015 |
| CN | 105207627 | A | 12/2015 |
| CN | 103891151 | B | 6/2016 |
| CN | 107171672 | A | 9/2017 |
| CN | 209659249 | U | 11/2019 |
| CN | 111293996 | A | 6/2020 |
| CN | 111711424 | A | 9/2020 |
| CN | 112187297 | A | 1/2021 |
| CN | 112187311 | A | 1/2021 |
| CN | 112910492 | A | 6/2021 |
| WO | 2022160934 | A1 | 4/2022 |

OTHER PUBLICATIONS

Chinese Second Office Action and search report in the corresponding Chinese Patent Application No. 202110128961.0, mailed Apr. 25, 2022.

International Search Report from International PCT Application No. PCT/CN2021/135418, mailed Feb. 21, 2022.

Written Opinion of the International Searching Authority in International Application No. PCT/CN2021/135418 mailed Feb. 21, 2022, with machine English translation provided by foreign counsel and by WIPO.

Extended European Search Report, European patent Application No. 21922524.0, mailed Jun. 13, 2024 (7 pages).

* cited by examiner

RADIO FREQUENCY PA MID DEVICE, RADIO FREQUENCY SYSTEMS, AND COMMUNICATION DEVICE

CROSS REFERENCE TO RELATED APPLICATIONS

The present disclosure is a continuation of International Patent Application No. PCT/CN2021/135418, filed Dec. 3, 2021, which claims the priority to Chinese Patent Application No. 202110128961.0, filed Jan. 29, 2021, both of which are herein incorporated by reference in their entireties.

TECHNICAL FIELD

The present disclosure relates to the field of communication technologies, and in particular to a radio frequency (RF) power amplifier module integrated duplexer (PA Mid) device, a RF system, and a communication device.

BACKGROUND

The description herein provides background information only in relation to the present disclosure and does not necessarily constitute prior art.

Currently, a wireless communication network technology is developing rapidly, and a communication mode has been rapidly upgraded from 2G to 3G/4G/5G with a higher bandwidth. As a bandwidth increases, the service content that may be brought to people is also becoming progressively richer. However, in order to achieve compatibility with signals of different communication modes, it is inevitable to sacrifice a transmission power of a radio frequency signal of some modes, resulting in an insufficient transmission power of the RF signal.

SUMMARY OF THE DISCLOSURE

According to a first aspect of the embodiments of the present disclosure, a radio frequency (RF) PA Mid device is provided. The RF PA Mid device is arranged with arranged with a first input port configured to receive a high-frequency signal of a first mode sent by a RF transceiver, a second input port configured to receive an intermediate-frequency signal of a second mode sent by the RF transceiver, and a first antenna port configured to connect an antenna, wherein the RF PA Mid device includes: a first switch, including two first ends and a second end, wherein the two first ends of the first switch being respectively connected with the first input port and the second input port in one-to-one correspondence, and the first switch being configured to selectively output the high-frequency signal of the first mode or the intermediate-frequency signal of the second mode; a plurality of first power amplifiers, wherein each of the plurality of first power amplifiers includes an input end and an output end, the input end of each of the plurality of first power amplifiers is connected with the second end of the first switch respectively, and each of the plurality of first power amplifiers is configured to support amplification processing of the high-frequency signal and the intermediate-frequency signal; and a first power combiner, including a plurality of input ends and an output end, wherein the plurality of input ends of the first power combiner are respectively connected with the output ends of the plurality of first power amplifiers in one-to-one correspondence, the output end of the first power combiner is connected with the first antenna port, and the first power combiner is configured to combine output powers of the plurality of first power amplifiers to output an intermediate-frequency signal with target power or a high-frequency signal with target power.

According to a second aspect of the embodiments of the present disclosure, a radio frequency (RF) system is provided. The RF system includes: a RF transceiver; the above-mentioned RF PA Mid device, connected with the RF transceiver; and an antenna set, connected to the antenna port of the RF PA Mid device and configured to transmit and receive a RF signal.

According to a third aspect of the embodiments of the present disclosure, a communication device. The communication device includes: the above-mentioned RF system; a power module connected with the above-mentioned RF PA Mid device and configured to provide power voltage for the RF PA Mid device. The power module includes at least one of a fixed voltage source and an adjustable voltage source.

BRIEF DESCRIPTION OF THE DRAWINGS

In order to illustrate more clearly the technical solutions in the embodiments or the related art of the present disclosure, the accompanying drawings used for the description of the embodiments or the related art will be described in brief in the following. Apparently, the drawings in the following description are only some of the embodiments of the present disclosure, and other drawings may be obtained by any ordinary skilled person in the art based on these drawings without any creative work.

DETAILED DESCRIPTION

In order to facilitate the understanding embodiments of the present disclosure, the present disclosure will be described more fully below with reference to the relevant drawings. The drawings show preferred embodiments of the present disclosure. However, the present disclosure may be implemented in many different forms and is not limited to the embodiments described herein. On the contrary, the purpose of providing these embodiments is to make the understanding of the present disclosure more thorough and comprehensive.

It should be understood that terms "first", "second", and so on, in the present disclosure are used herein to describe various elements, but the elements are not limited by the terms. The terms are used only to distinguish one element from another element. For example, without departing from the scope of the present disclosure, a first power amplifier may be named as a second power amplifier, and similarly, the second power amplifier may be named as the first power amplifier. Both the first power amplifier and the second power amplifier are power amplifiers, but they are not the same power amplifier.

In addition, terms "first" and "second" are used for descriptive purposes only and shall not be understood as indicating or implying relative importance or implicitly specifying the number of technical features indicated. Therefore, a feature defined by the "first" and "second" may explicitly or implicitly include at least one such feature. In the description of the present disclosure, "plurality" means at least two, such as two, three, and so on, unless otherwise expressly and specifically limited.

Figure 1:
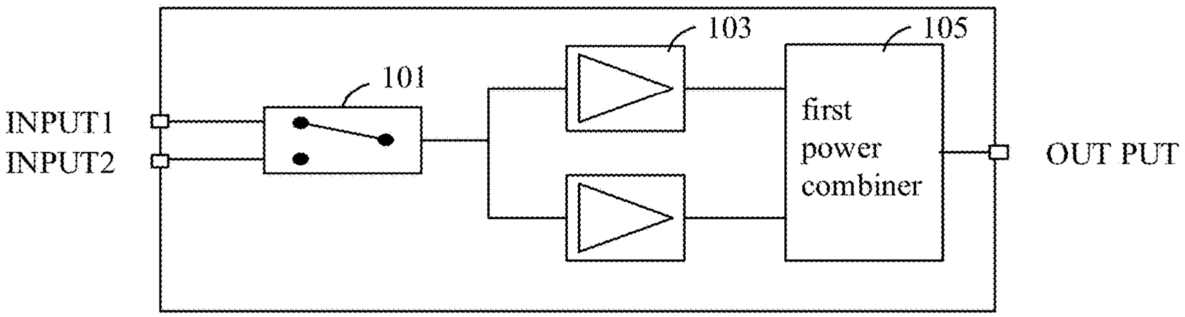
FIG. 1 is a first structural schematic view of a radio frequency (RF) power amplifier module integrated duplexer (PA Mid) device according to an embodiment of the present disclosure.

The present disclosure provides a radio frequency (RF) power amplifier module integrated duplexer (PA Mid) device, which may be applied to a communication device with wireless communication function. The communication device may be a handheld device, an in-vehicle devices, a wearable device, a computing device, or other processing devices connected to wireless modems, and various kinds of user equipment (UE), such as a mobile phone, a mobile station (MS), and so on. For convenience of description, the above-mentioned device may be referred to as the communication device. FIG. 1 is a first structural schematic view of a radio frequency PA Mid device according to an embodiment of the present disclosure. The RF PA Mid device according to the embodiments of the present disclosure may be understood as power amplifier modules including duplexers with LNA (L-PA Mid) with low-noise amplifiers being arranged therein. The RF PA Mid device may support transmission of a plurality of signals in different frequency bands, so as to achieve transmission switching control of a signal. The RF PA Mid device according to the embodiments of the present disclosure may support transmission control of signals of different modes. The RF PA Mid device may be understood as a package structure. The RF PA Mid device may be arranged with a plurality of input ports (for example, IN PUT1, INPUT2) configured to connect a RF transceiver, and at least one antenna port OUT PUT configured to connect an antenna. The input ports IN PUT1, INPUT2, and the antenna port OUT PUT may be understood as RF pin terminals of the RF PA Mid device, and the RF pin terminals may be configured to connect with various external devices. The input ports IN PUT1, INPUT2 are configured to receive a plurality of RF signals sent by the RF transceiver. The RF PA Mid device may perform amplification processing on a plurality of input signals, so as to output the signals to the antenna port OUT PUT, and the signals are transmitted by the antenna connected with the antenna port OUT PUT, thereby achieve transmission control of the plurality of RF signal.

As shown in FIG. 1, in the embodiment, the RF PA Mid device is arranged with a first input port INPUT1 configured to connect with the RF transceiver, a second input port INPUT2 configured to connect with the RF transceiver, and a first antenna port OUTPUT configured to connect with an antenna. The first input port INPUT1 is configured to receive a high-frequency signal of a first mode sent by the RF transceiver, and the second input port INPUT2 is configured to receive an intermediate-frequency signal of a second mode sent by the RF transceiver. Signals of different modes may support different services. For example, a RF signal of the first mode may be mainly configured to support voice call service, and a RF signal of the second mode may be mainly configured to support internet service.

In some embodiments, the RF PA Mid device includes a first switch 101, a first power combiner 105, and a plurality of first power amplifiers 103. Two first ends of the first switch 101 are respectively connected with the first input port INPUT1 and the second input port INPUT2 in one-to-one correspondence, and a second end of the first switch 101 is respectively connected with an input end of each of the plurality of first power amplifiers 103. The first switch 101 is configured to selectively output the high-frequency signal of the first mode or the intermediate-frequency signal of the second mode to each of the plurality of first power amplifiers 103. In some embodiments, the first switch 101 may be a single-pole double-throw switch or other types of electronic switches.

Further, an electrical connection between the first switch 101 and each of the plurality of first power amplifiers 103 may be directly connected through a RF wiring.

Each of the plurality of first power amplifiers 103 may be configured to support amplification processing of the high-frequency signal of the first mode and the intermediate-frequency signal of the second mode. An output end of each of the plurality of first power amplifiers 103 corresponds to each input end of the first power combiner 105. Each of the plurality of first power amplifiers 103 may simultaneously perform amplification processing on the received high-frequency signal of the first mode, and may output the high-frequency signal of the first mode on which the amplification processing has been performed to the first power combiner 105. In some embodiments, each of the plurality of first power amplifiers 103 may further perform amplification processing on the received intermediate-frequency signal of the second mode at the same time, and output the intermediate-frequency signal of the second mode on which the amplification processing has been performed to the first power combiner 105.

An output end of the first power combiner 105 is connected to the first antenna port OUTPUT. The first power combiner 105 may simultaneously receive the high-frequency signal of the first mode output by each of the plurality of first power amplifiers 103, and combine the output power of the high-frequency signal of each first mode, thereby enabling a power value of the high-frequency signal of the first mode output to the first antenna port OUTPUT to reach a target power. In some embodiments, the first power combiner 105 may simultaneously receive the intermediate-frequency signal of the second mode output by each of the plurality of first power amplifiers 103, and combine the output power of the intermediate-frequency signal of each second mode, thereby enabling a power value of the intermediate-frequency signal of the second mode output to the first antenna port OUTPUT to reach a target power. The target power may be understood as the minimum standard power that may support a frequency band signal of a corresponding mode, for example, the minimum standard for the high-frequency signal of the first mode is 33 dBm. Exemplarily, if the output power of the first power amplifier 103 may be greater than 1 W (30 dBm), the output power of the first power combiner 105 on which the power combining processing has been performed may be greater than 2 W (33 dBm), thereby meeting communication standards of the high-frequency signal of the first mode and the intermediate-frequency signal of the second mode at the same time.

It should be noted that the number of the input ends of the first power combiner 105 may be set according to the number of the plurality of first power amplifiers 103. For example, if the number of the plurality of first power amplifiers 103 is two, the first power combiner 105 may be a dual-channel power combiner. If the number of the plurality of first power amplifiers 103 is three, the first power combiner 105 may be a three-channel power combiner or the like.

In the radio frequency PA Mid device of the above-mentioned embodiments, by arranging the first switch 101, the first power combiner 105, and the plurality of first power amplifiers 103, the first power combiner 105 may perform combining processing on the output power of the RF signal (for example, the high-frequency signal of the first mode or the intermediate-frequency signal of the second mode) output by the plurality of first power amplifiers 103. In this way, the power value of the RF signal output to the first antenna port OUTPUT may meet the target power of the communication standard, thereby enabling the RF PA Mid device to have a function of supporting transmission of the first mode high-frequency signal (such as a 2G Global System for Mobile Communications (GSM)) high-frequency signal or the second mode intermediate-frequency signal (such as a 4G Long Term Evolution (LTE) intermediate-frequency signal). Furthermore, it is possible to reduce a case that a plurality of independent RF transmission modules are arranged to support transmission control of the high-frequency signal of the first mode, and the intermediate-frequency signal and the high-frequency signal of the second mode in the related art, thereby improving an integration of the RF PA Mid device, reducing a length of the RF wiring, reducing loss on a transmission path, and improving transmission power of the RF signal. In addition, a space occupied by the RF PA Mid device may be reduced.

Figure 2:
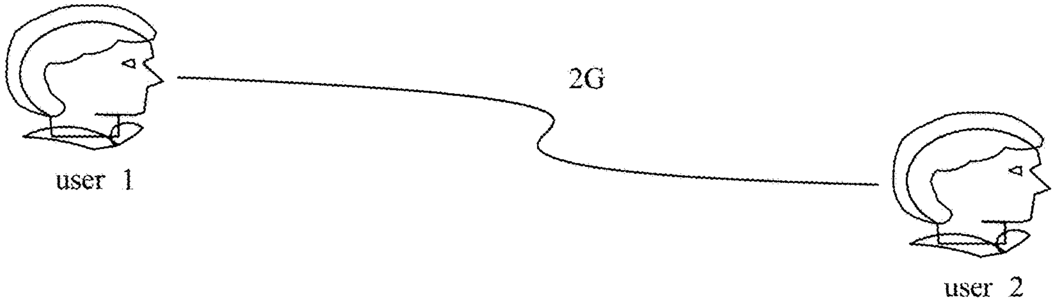
FIG. 2 is a schematic view of a principle of 2G call according to an embodiment of the present disclosure.

In an embodiment, the first mode is mainly configured to support the voice call service, and the second mode is mainly configured to support the internet service. For example, the first mode may be a 2G communication mode, such as a Global System for Mobile Communications (GSM) communication mode. The high-frequency signal of the first mode may be a 2G high-frequency signal, for example, the 2G high-frequency signal may include at least GSM1800, GSM1900, and other frequency band signals. As shown in FIG. 2, a speech implementation under a 2G network is achieved by using a network called Circuit Switched (CS). In short, during an entire call process, a "dedicated" channel may be occupied by both parties to the call all the time, and no one else may occupy the "dedicated" channel anymore. Therefore, when the 2G is configured for voice calls, it is equivalent to have a separate dedicated channel. In some remote areas, an area with poor transportation, and an area with relatively weak population density, the 2G network is still the most important communication method. Therefore, the mobile terminal will always support the 2G network today and in the following decades.

Figure 3:
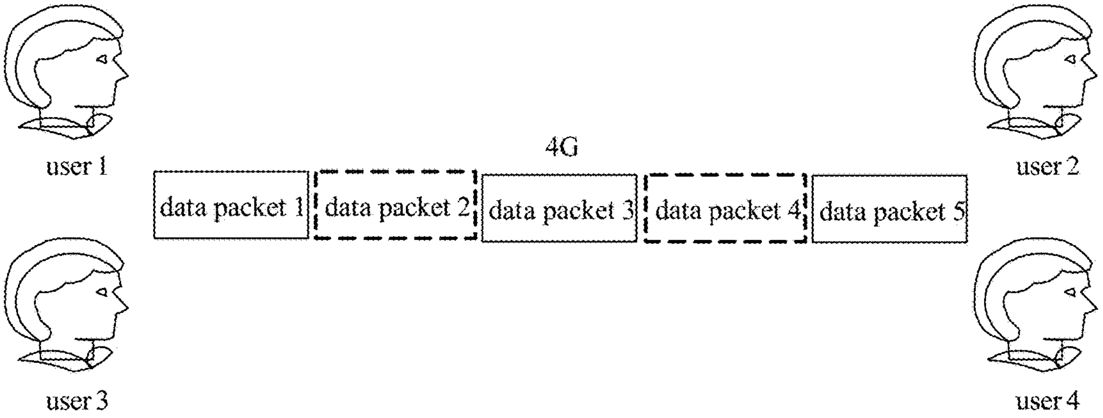
FIG. 3 is a schematic view of a principle of 4G internet access according to an embodiment of the present disclosure. a schematic FIG.

The second mode may be a 4G communication mode, such as a Long Term Evolution (LTE) communication mode. The intermediate-frequency signal of the second mode may be a 4G intermediate-frequency signal, for example, the 4G intermediate-frequency signal may include at least B1, B3, B34, B39, and other frequency band signals. As shown in FIG. 3, a network called Packet Switch (PS) is used by a 4G network, and the network called the PS is essentially the same as using WeChat, using Weibo, or watching video on a mobile phone. Both voice and data packets are addressed to the destination via various switching and routing devices in a form of an IP packet in the network. A communication link is not exclusively used by a user 1 and a user 2, but is shared by two groups: the user 1 and the user 2, and a user 3 and a user 4. A data packet may be automatically assigned by a system based on each person's service requirement, packets 1, 3, and 5 are used by the user 1 and the user 2, and packets 2 and 4 are used by the user 3 and the user 4. However, in a communication process of the 4G network, it is difficult to ensure a quality of service only by means of relying on the IP packet to transmit the voice service, because an IP protocol configured to transmit the IP packet is a non-reliable transmission protocol, that is, an interference on the transmission path or other reasons may lead to the transmission failure of some data packets.

As shown in Table 1, the transmission power of a 2G GSM low band (LB) signal (referred to as a low-frequency signal) is 10 dB higher than that of 4G LTE PC3 and 5G NR PC3. The 2G GSM LB has a frequency of 824 MHz to 960 MHz, and the transmission power of the 2G GSM LB is 7 dB higher than that of 4G LTE PC2 and 5G NR PC2. The transmission power of 2G GSM high band (HB) signal (referred to as a high-frequency signal) is 7 dB higher than that of the 4G LTE PC3 and the 5G NR PC3, and the transmission power of the 2G high-frequency signal is 4 dB higher than that of the 4G LTE PC2 and the 5G NR PC2. The 2G LB has a frequency of 1710 MHz to 1990 MHz.

TABLE 1

Table of Transmission Power of Different Communication Modes

| communication mode | | transmitting power |
|---|---|---|
| 2G GSM | Low-frequency band (LB) | 33 dBm |
| | High-frequency band (HB) | 30 dBm |
| 4G LTE | PC3 | 23 dBm |
| | PC2 | 26 dBm |
| 5G NR | PC3 | 23 dBm |
| | PC2 | 26 dBm |

Furthermore, a communication distance between the communication device and a base station is directly related to the transmission power, and a total spatial attenuation of an electromagnetic wave may be calculated according to the following formula:

$$ATT = \text{receiving sensitivity} + \text{transmitting power} = 32.45 + 20\ \lg(F) + 20\ \lg(D);$$

Where, the ATT is the total spatial attenuation, and a unit of the total spatial attenuation is dB; the F is the frequency of the RF signal, and a unit of the frequency is MHz; and the D is the communication distance between the communication device and the base station, and a unit of the communication distance is KM.

According to the foregoing formula, it can be seen that, due to a high transmission power of the 2G GSM, and the same reception sensitivity of the base station for 2G, 4G, and 5G at the same bandwidth, the total spatial attenuation mainly depends on the transmission power. That is, the higher the transmission power, the greater the total spatial attenuation, and the greater the communication distance between the communication device and the base station.

The base station for the 2G, 4G, and 5G at the same bandwidth has the same reception sensitivity, and the ATT mainly depends on the transmission power. The higher the transmission power, the greater the ATT, and the greater the communication distance D, as shown in Table 2.

TABLE 2

Comparison of Communication Distance between Different Communication modes

| communication mode | | 4G | 5G |
|---|---|---|---|
| 2G GSM | 33 dBm | +172% | +172% |
| | 30 dBm | +114% | +114% |

That is, the communication distance of the 2G low-frequency signal is 172% greater than that of the 4G and 5G, which is 2.7 times that of the latter. The communication distance of 2G high-frequency signal is 114% greater than that of the 4G and 5G, which is 2.1 times that of the latter. A longer communication distance provides the user with a stronger mobile phone signal and a better voice service quality. From this, it may be seen that in order to solve a problem of poor transmission quality and reliability in 4G networks, the mobile phone may switch from the 4G network to the 2G network when making calls under the 4G network, thereby ensuring the quality of voice calls.

In the embodiment of the present disclosure, the plurality of first power amplifiers 103 are arranged to be capable of supporting the 2G GSM high-frequency signal and the 4G LTE intermediate-frequency signal at the same time. A plurality of 2G GSM high-frequency signals on which the power amplification processing have been performed by the first power amplifier 103 may be further performed power combining processing by the first power combiner 105, and thus a target power meeting the 2G GSM high-frequency signal may be output, for example, 33 dBm. In addition, a plurality of 4G LTE intermediate-frequency signals on which the power amplification processing have been performed by the first power amplifier 103 may be further performed power combining processing by the first power combiner 105, and thus the target power meeting the 4G LTE intermediate-frequency signal may be output, for example, 33 dBm. Therefore, the RF PA Mid device has the function of supporting transmission processing of the 2G GSM high-frequency signal and the 4G LTE intermediate-frequency signal. In this way, it may be reduce a case that a first RF transmitting module supporting the 2G GSM low-frequency signal and the 2G GSM high-frequency signal needs to transmit the 2G GSM high-frequency signal to a second RF transmitting module configured to support the 4G LTE intermediate-frequency signal via an additional RF wiring in the related art, which may be transmitted via the antenna configured to support the intermediate-frequency signal and high-frequency signal. Therefore, it is possible to reduce the length of the RF wiring, reduce the loss on the transmission path, and improve the transmission power of the 2G GSM high-frequency signal, thereby increasing the communication distance thereof, for example, the communication distance may be increased by 20%-25%, which means that the communication distance may be increased by a quarter.

Figure 4:
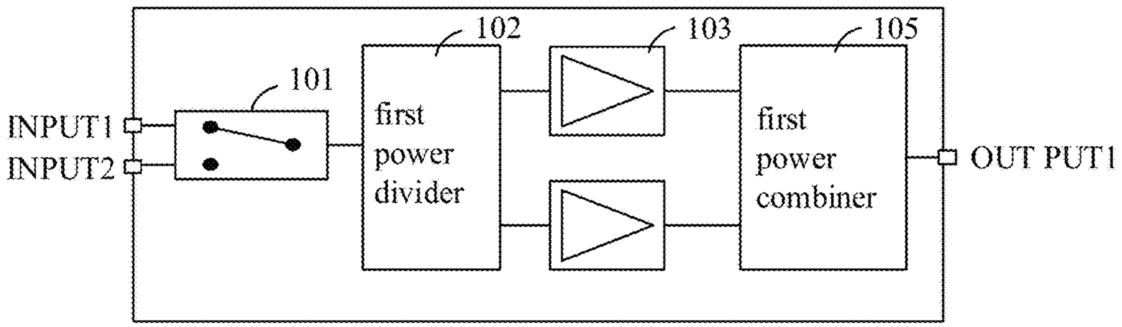
FIG. 4 is a second structural schematic view of the RF PA Mid device according to an embodiment of the present disclosure.

As shown in FIG. 4, in an embodiment, the RF PA Mid device further includes a first power divider 102. An input end of the first power divider 102 is connected with the second end of the first switch 101, and a plurality of output ends of the first power divider 102 are respectively connected with the input ends of the plurality of first power amplifiers 103 in one-to-one correspondence, and the first power divider 102 is configured to perform power allocation processing on the high-frequency signal of the first mode and the intermediate-frequency signal of the second mode. In some embodiments, the first power divider 102 may perform equal/un-equal power allocation processing on the received high-frequency signal of the first mode and the intermediate-frequency signal of the second mode. The first power divider 102 may be a device with a power allocation function, such as a power divider, a combiner, etc.

The number of the output ends of the first power divider 102 is related to the number of the plurality of first power amplifiers 103, for example, the number of the output ends of the first power divider 102 is equal to the number of the first power amplifiers 103. In some embodiments, the number of the plurality of first power amplifiers 103 is two, and the first power divider 102 may be a dual-channel power divider. Two output ends of the dual-channel power divider are respectively connected to the input ends of the two first power amplifiers 103 in one-to-one correspondence, and the output ends of the two first power amplifiers 103 are connected to the first power combiner 105. That is to say, the two first power amplifiers 103 may simultaneously amplify the received high-frequency signal of the first mode. For example, each of the plurality of first power amplifiers 103 may output a power more than 1 W (30 dBm), and the high-frequency signal on which the amplification processing has been performed may be combined by the first power combiner 105. In this way, a total power value of the high-frequency signal output by the first power combiner 105 may be doubled (3 dB), for example, the total output power may reach 2 W (33 dBm). Correspondingly, the two first power amplifiers 103 may simultaneously amplify the received intermediate-frequency signal of the second mode. For example, each of the plurality of first power amplifiers 103 may output a power more than 1 W (30 dBm), and the intermediate-frequency signal of the second mode on which the amplification processing has been performed may be combined by the first power combiner 105. In this way, a total power value of the second mode intermediate-frequency signal output by the first power combiner 105 may be doubled (3 dB), for example, the total output power may reach 2 W (33 dBm), thereby meeting the communication standard of the high-frequency signal of first mode and the intermediate-frequency signal of first mode. The output power of each of the plurality of first power amplifiers 103 may be combined by the first power combiner 105 via various power combining methods such as a differential power combining method, and a balance method.

In some embodiments, the number of the first power amplifiers 103 may also be three, and the corresponding first power combiner 105 may be a three-channel power divider. In some embodiments, when the number of the plurality of first power amplifiers 103 is n, the output power of each first power amplifier may be Pout0, the corresponding first power combiner 105 may be a n-channel power divider, and a total output power of the n-channel power divider meets a requirement of n*Pout0=33 dBm.

In the above-mentioned embodiments, compared with the RF PA Mid device arranged with three first power amplifiers 103, the RF PA Mid device arranged with two first power amplifiers 103 may reduce a volume of the RF PA Mid device, which is conducive to a miniaturization of the device. It should be noted that, in the embodiment of the present disclosure, the number of the first power amplifiers 103, the output power of each of the plurality of first power amplifiers 103, and the combing method of the first power combiner 105 are not further limited, and may be set according to actual needs.

Figure 5:
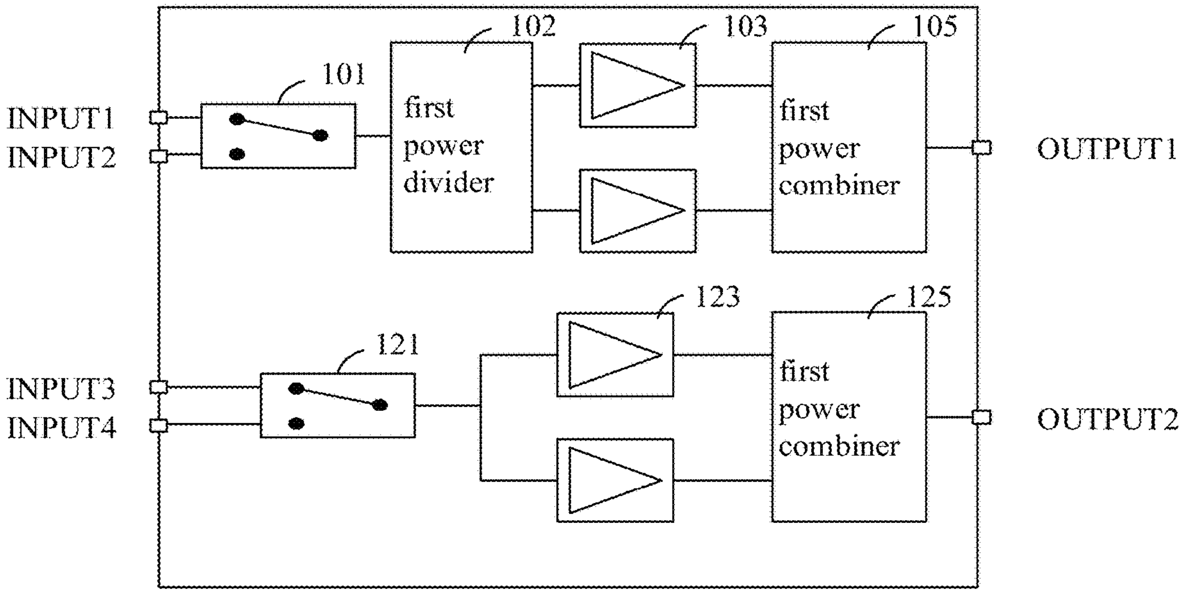
FIG. 5 is a third structural schematic view of the RF PA Mid device according to an embodiment of the present disclosure.

In an embodiment, on the basis of any of the above embodiments, as shown in FIG. 5, the RF PA Mid device is further arranged with a third input port INPUT3, a fourth input port INPUT4, and a second antenna port OUTPUT2. The third input port INPUT3 is configured to receive a low-frequency signal of the first mode output by the RF transceiver, and the fourth input port INPUT4 is configured to receive a low-frequency signal of the second mode output by the RF transceiver. In some embodiments, the low-frequency signal of the first mode may be a 2G low-frequency signal, for example, the 2G low-frequency signal may include at least frequency band signals such as GSM850, GSM900, etc. The low-frequency signal of the second mode may be a 4G low-frequency signal, for example, the 4G low-frequency signal may include at least frequency band signals such as B5, B8, B28, etc.

The RF PA Mid device further includes a second switch 121, a second power combiner 125, and a plurality of second power amplifiers 123. Two first ends of the second switch 121 are respectively connected with the third input port INPUT3 and the fourth input port INPUT4 in one-to-one correspondence, and a second end of the second switch 121 is respectively connected with each of the plurality of second power amplifiers 123. In this way, the second switch 121 is configured to selectively output the low-frequency signal of the first mode and the low-frequency signal of the second mode to each of the plurality of second power amplifiers 123. In some embodiments, the second switch 121 may also be a single-pole double-throw switch or other switch combination forms that may realize selective switching.

The second power amplifier 123 is configured to support amplification processing of the low-frequency signal of the first mode and the low-frequency signal of the second mode. That is to say, each of the plurality of second power amplifiers 123 may support amplification processing of low-frequency signals of different modes. An output end of each of the plurality of second power amplifiers 123 may be respectively connected to the corresponding input end of the second power combiner 125, and the low-frequency signal on which the amplification processing has been performed may be output to the second power combiner 125 for power combining.

The output end of the second power combiner 125 is connected to the second antenna port OUTPUT2. The second power combiner 125 may simultaneously receive the low-frequency signal of the first mode output by each of the plurality of second power amplifiers 123, and combine the power of the low-frequency signal of each first mode, thereby enabling a power value of the output low-frequency signal of the first mode to reach a target power. In some embodiments, the second power combiner 125 may simultaneously receive the low-frequency signal of the second mode output by each of the plurality of second power amplifiers 123, and combine the power of the low-frequency signal of each second mode, thereby enabling a power value of the output low-frequency signal of the second mode to reach a target power. The target power may be understood as the minimum standard power that may support a low-frequency signal of a corresponding mode. Exemplarily, if the power value of the signal output by the second power amplifier 123 may be greater than 1 W (30 dBm), the output power of the second power combiner 125 after power combining processing is performed may be greater than 2 W (33 dBm), thereby meeting the communication standards of the low-frequency signal of the first mode and the low-frequency signal of the second mode.

It should be noted that the number of the input ends of the second power combiner 125 may be set according to the number of the plurality of second power amplifiers 123. For example, if the number of the second power amplifiers 123 is two, the second power combiner 125 may be a dual-channel power combiner. If the number of the plurality of second power amplifiers 123 is three, the second power combiner 125 may be a three-channel power combiner or the like.

By arranging the plurality of first power amplifiers 103, the first power combiner 105, the plurality of second power amplifiers 123, and the second power combiner 125, the radio frequency PA Mid device in the above-mentioned embodiments may support transmission control of the low-frequency signal and the high-frequency signal of the first mode. At the same time, the radio frequency PA Mid device may further support transmission control of the low-frequency signal and the intermediate-frequency signal of the second mode, thereby extending a frequency band range of the RF signal that may be transmitted by the RF PA Mid device. At the same time, it is possible to reduce a case that a plurality of RF transmission modules are arranged to support transmission of RF signals of different frequency bands and different modes in the related art, thereby improving the integration of the RF PA Mid device, reducing the length of the RF wiring, reducing loss of the wiring, and improving the transmission power of the RF signal. In addition, the space occupied by the RF PA Mid device may be reduced.

Figure 6:
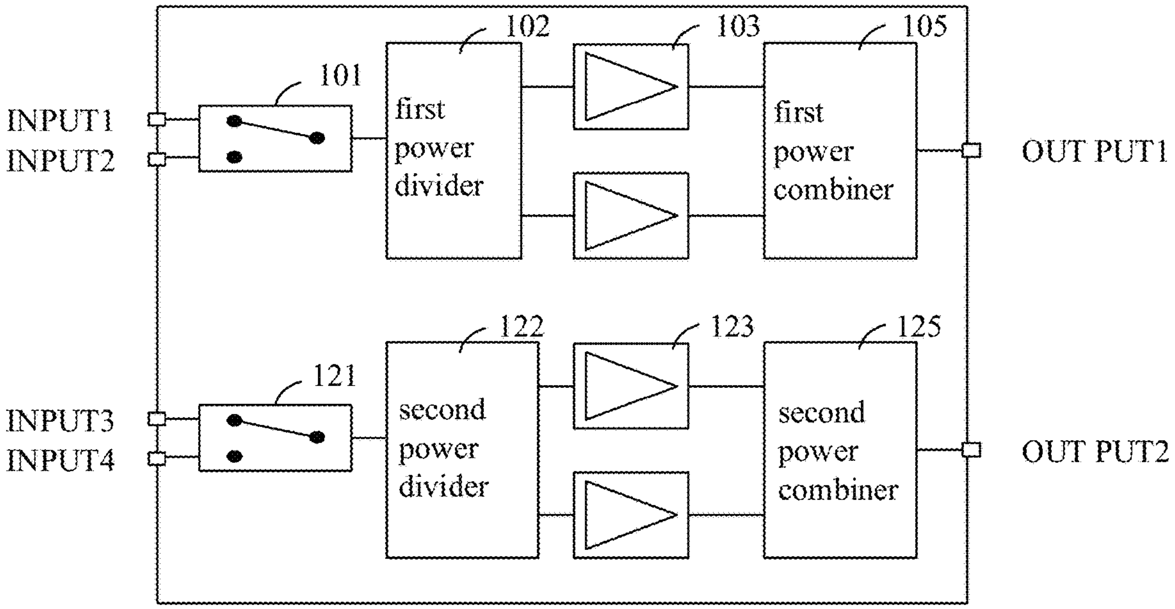
FIG. 6 is a fourth structural schematic view of the RF PA Mid device according to an embodiment of the present disclosure.

As shown in FIG. 6, in an embodiment, the RF PA Mid device further includes a second power divider 122. An input end of the second power divider 122 is connected with the second end of the second switch 121, and a plurality of output ends of the second power divider 122 are respectively connected with the input ends of the plurality of second power amplifiers 123 in one-to-one correspondence. The second power divider 122 is configured to perform power allocation processing on the low-frequency signal of the first mode and the low-frequency signal of the second mode. In some embodiments, the second power divider 122 may perform equal/un-equal power allocation processing on the received low-frequency signals of the first mode and the second mode. In some embodiments, the second power divider 122 may be a device with a power allocation function, such as a power divider, a combiner, etc. In some embodiments, the number of power allocation paths of the second power divider 122 is related to the number of the plurality of second power amplifiers 123, for example, the number of the power allocation paths of the second power divider is equal to the number of the plurality of second power dividers. In some embodiments, the number of the plurality of second power amplifiers 123 is two, and the second power divider 122 may be a dual-channel power divider. The input ends of two second power amplifiers 123 are respectively connected to two output ends of the dual-channel power divider in one-to-one correspondence, and the output ends of the two second power amplifiers 123 are connected to the second antenna port OUTPUT2. That is to say, two second power amplifiers 123 may simultaneously amplify the received low-frequency signal of the first mode. For example, each of the plurality of second power amplifiers 123 may output a power more than 1 W (30 dBm), and the low-frequency signal on which the amplification processing has been performed may be combined by the second power combiner 125. In this way, a total power value of the low-frequency signal output by the second power combiner 125 may be doubled (3 dB), for example, the total output power may reach 2 W (33 dBm), thereby meeting the communication standard of the 2G GSM low-frequency signal and the 4G LTE low-frequency signal.

The output power of each of the plurality of second power amplifiers 123 may be combined by the second power combiner 125 via various power combining methods such as the differential power combining method, and the balance method.

In some embodiments, the number of the second power amplifiers 123 may also be three, and the corresponding second power combiner 125 may be a three-channel power divider. In some embodiments, when the number of the plurality of second power amplifiers 123 is n, the output power of each second power amplifier may be Pout0, the corresponding second power combiner 125 may be a n-channel power divider, and a total output power of the n-channel power divider meets a requirement of n*Pout0=33 dBm.

In this embodiment, the RF PA Mid device is arranged with the plurality of first power amplifiers 103, the plurality of second power amplifiers 123, the first power combiner 105, and the second power combiner 125. The power amplifier configured to support amplification processing of the GSM high-frequency signal and the LTE intermediate-frequency signal may be multiplexed with the first power amplifier 103, the power amplifier configured to support amplification processing of the GSM low-frequency signal and the LTE low-frequency signal may be multiplexed with the second power amplifier 123, and then the power combiner may perform the power combining processing on the GSM low-frequency signal and the LTE low-frequency signal. In this way, a total power output capability of the RF PA Mid device may be improved, for example, the total power output capability may be doubled (3 dB), and the output power capability may meet the communication requirement of the GSM communication and the LTE communication. Compared with the related art, it is possible to increase the total output power of the GSM high-frequency signals by 1.2 dB, and the communication distance may be significantly increased by 20%-25%, which means that the communication distance may be increased by a quarter.

Figure 7:
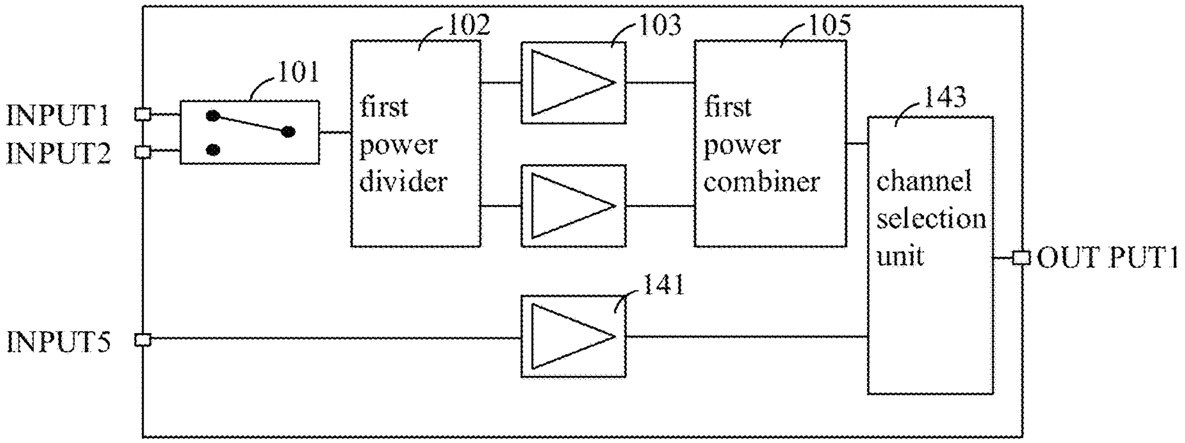
FIG. 7 is a fifth structural schematic view of the RF PA Mid device according to an embodiment of the present disclosure.
Figure 8:
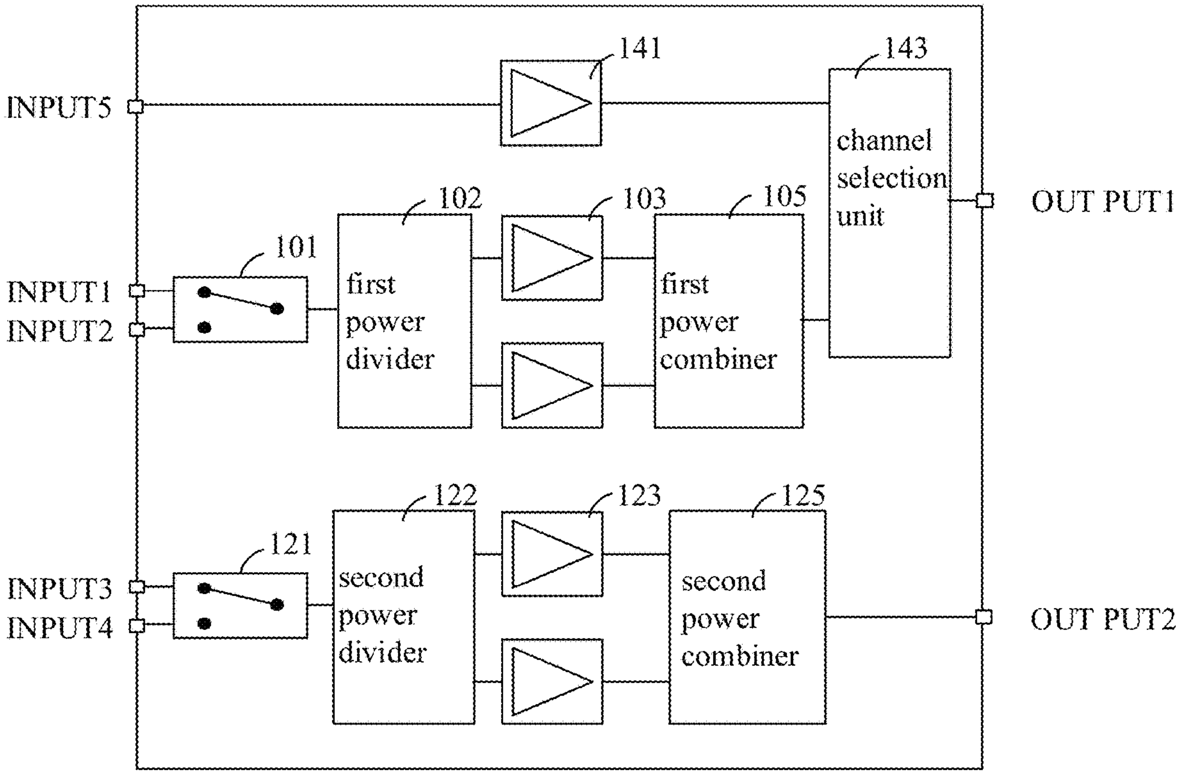
FIG. 8 is a sixth structural schematic view of the RF PA Mid device according to an embodiment of the present disclosure.

As shown in FIG. 7 and FIG. 8, in an embodiment, on the basis of any of the above embodiments, the RF PA Mid device is further arranged with a fifth input port INPUT5. The fifth input port INPUT5 is configured to receive the high-frequency signal of the second mode output by the RF transceiver. The high-frequency signal of the second mode may be a 4G high-frequency signal, for example, the 4G high-frequency signal may include at least frequency band signals such as B7, B38, B40, B41, etc. The RF PA Mid device may further include a third power amplifier 141 and a channel selection unit 143. An input end of the third power amplifier 141 is connected to the fifth input port INPUT5, and the third power amplifier 141 is configured to perform amplification processing on the received high-frequency signal of the second mode. Two first ends of the channel selection unit 143 are respectively connected with the output end of the first power combiner 105 and the output end of the third power amplifier 141 in one-to-one correspondence, and a second end of the channel selection unit 143 is connected with the first antenna port OUTPUT1. In this way, the channel selection unit 143 is configured to selectively output the intermediate-frequency signal of the first mode or the intermediate-frequency signal and the high-frequency signal of the second mode to the first antenna port OUTPUT1.

In this embodiment, the RF PA Mid device may further support transmission control of the high-frequency signal of the second mode, thereby expanding a frequency range of the transmission signal of the RF PA Mid device. In addition, compared with a case that a plurality of RF transmission modules are independently arranged to achieve transmission control of the RF signals of the different frequency bands and the different modes, the third power amplifier 141 and channel selection unit 143 are arranged in the RF PA Mid device, thereby improving the integration of the RF PA Mid device and reducing the space occupied by the RF PA Mid device.

In an embodiment, the channel selection unit 143 may be a single-pole double-throw switch. Two selection terminals of the single-pole double-throw switch are respectively connected to the first power combiner 105 and the third power amplifier 141, and a single terminal of the single-pole double-throw switch is connected to the first antenna port OUTPUT1. The single-pole double-throw switch may choose to output the intermediate-frequency signal of the first mode, the intermediate-frequency signal of the second mode, or the high-frequency signal of the second mode to the first antenna port OUTPUT1.

In an embodiment, the channel selection unit 143 may be a dual-channel combiner. Two input ends of the dual-channel combiner are respectively connected to the first power combiner 105 and the third power amplifier 141, and an output end of the dual-channel combiner is connected to the first antenna port OUTPUT1. The dual-channel combiner is configured to aggregate the received two RF signals (for example, the dual-channel combiner is configured to aggregate the high-frequency signals of the first mode and the second mode, or the dual-channel combiner is configured to aggregate the intermediate-frequency signal of the second mode and the high-frequency signal of the second mode), and transmit the aggregated RF signal to the first antenna port OUTPUT1.

In this embodiment, by arranging the channel selection unit as the dual-channel combiner, aggregation processing of the RF signals of different frequency bands may be achieved, for example, it is possible to aggregate the 4G intermediate-frequency signal and the 4G high-frequency signal, or aggregate the 2G high-frequency signal and the 4G high-frequency signal. in this way, it is possible to enable the RF PA Mid device to simultaneously transmit the aggregated RF signal, thereby expanding an operating frequency range of the RF PA Mid device.

Figure 9:
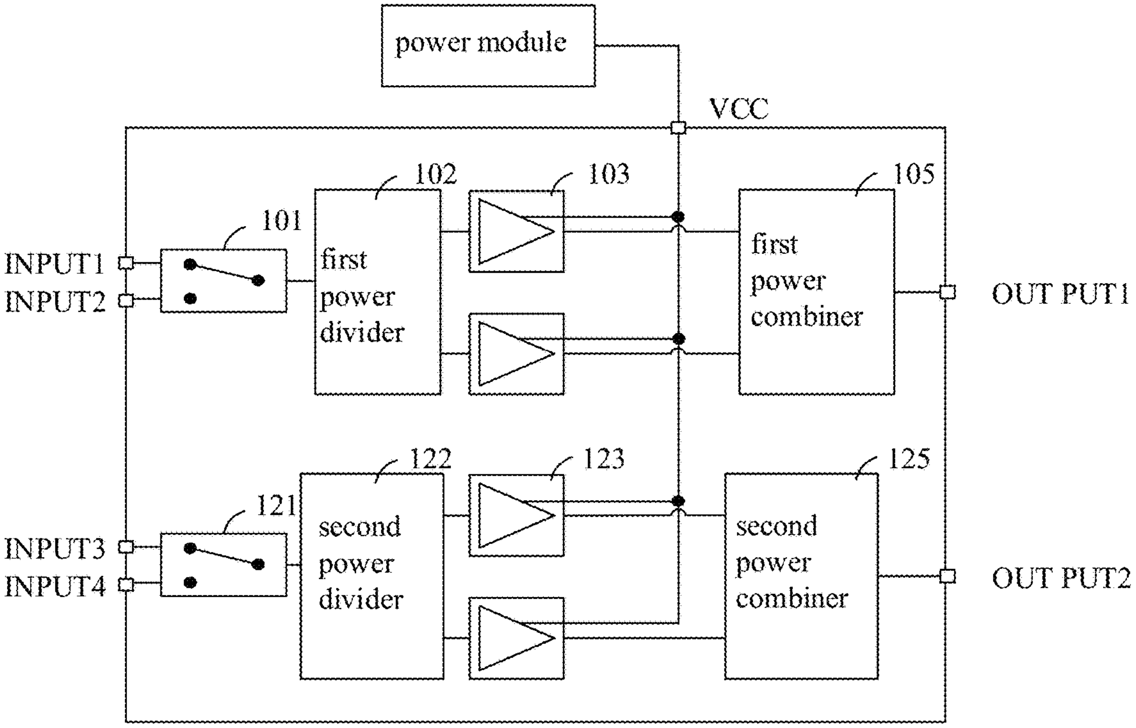
FIG. 9 is a seventh structural schematic view of the RF PA Mid device according to an embodiment of the present disclosure.
Figure 10:
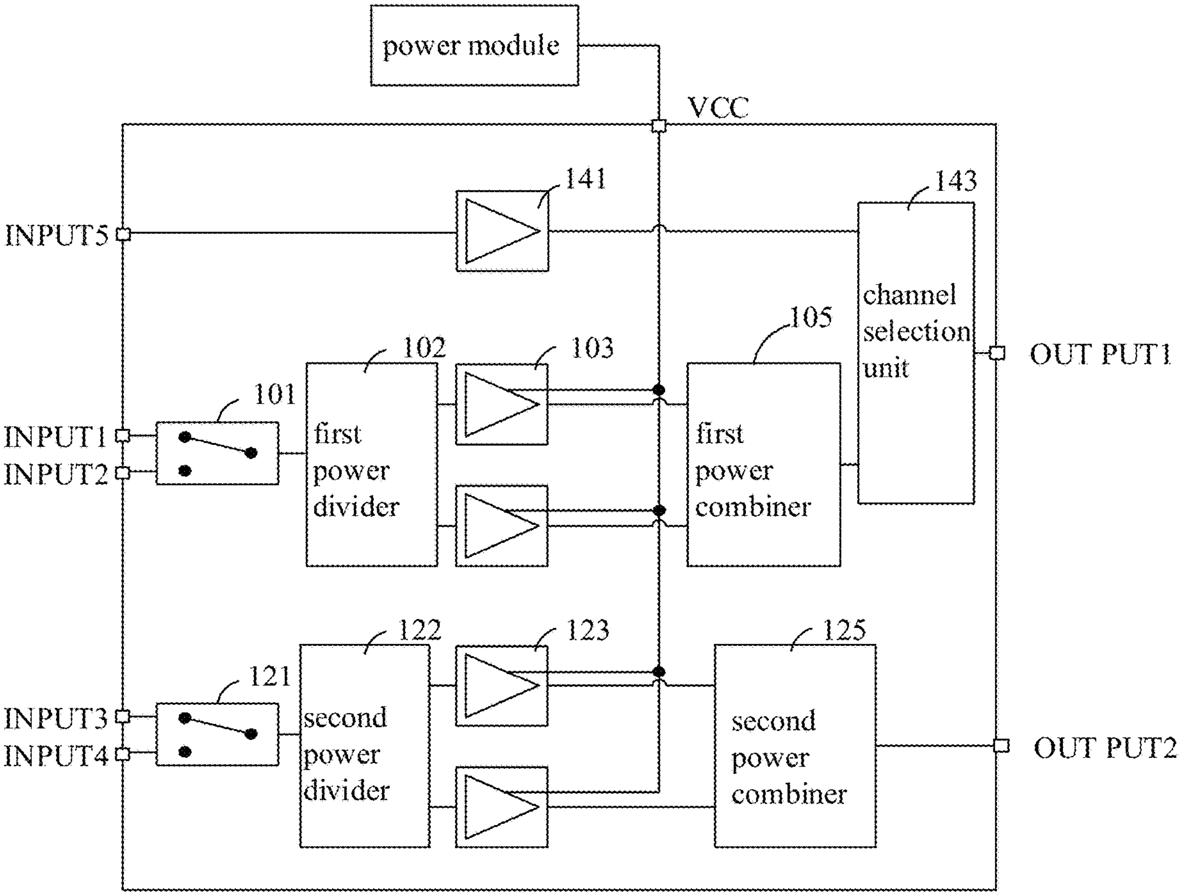
FIG. 10 is an eighth structural schematic view of the RF PA Mid device according to an embodiment of the present disclosure.

As shown in FIG. 9 and FIG. 10, in an embodiment, the RF PA Mid device is further arranged with a power port VCC. The power port VCC may be configured to connect with an external power module and receive a power voltage in a range from 4.2V to 6V. In some embodiments, the power port VCC of the RF PA Mid device may be connected to a power supply terminal of each power amplifier to provide power to the each power amplifier. It should be noted that the each power amplifier may include at least one of the first power amplifier 103, the second power amplifier 123, and the third power amplifier 141 of the RF PA Mid device.

In some embodiments, an operating voltage of the power amplifier directly determines the output power thereof. In some embodiments, the output power of the power amplifier is calculated according to the following formula:

$$Pout=VCC^2/R;$$

Where, the Pout is the output power of the power amplifier; the VCC is the operating voltage of the power amplifier; and the R is an output load impedance of the power amplifier. It may be seen from the above formula that, as the operating voltage of the power amplifier increases, the output power of the power amplifier may also be greatly increased accordingly, and the output power on which the combining processing has been performed by the first power combiner 105 and the second power combiner 125 may also increase accordingly, thereby further improving the output power of the RF PA Mid device.

Figure 11:
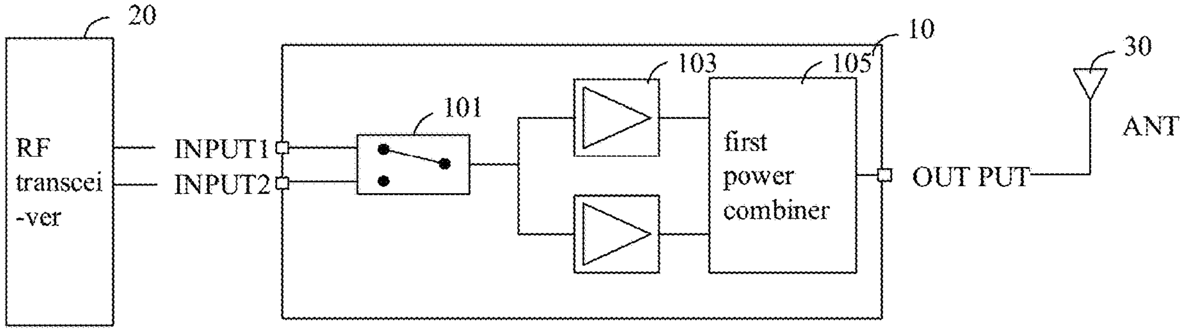
FIG. 11 is first a structural schematic view of a RF system according to an embodiment of the present disclosure.
Figure 12:
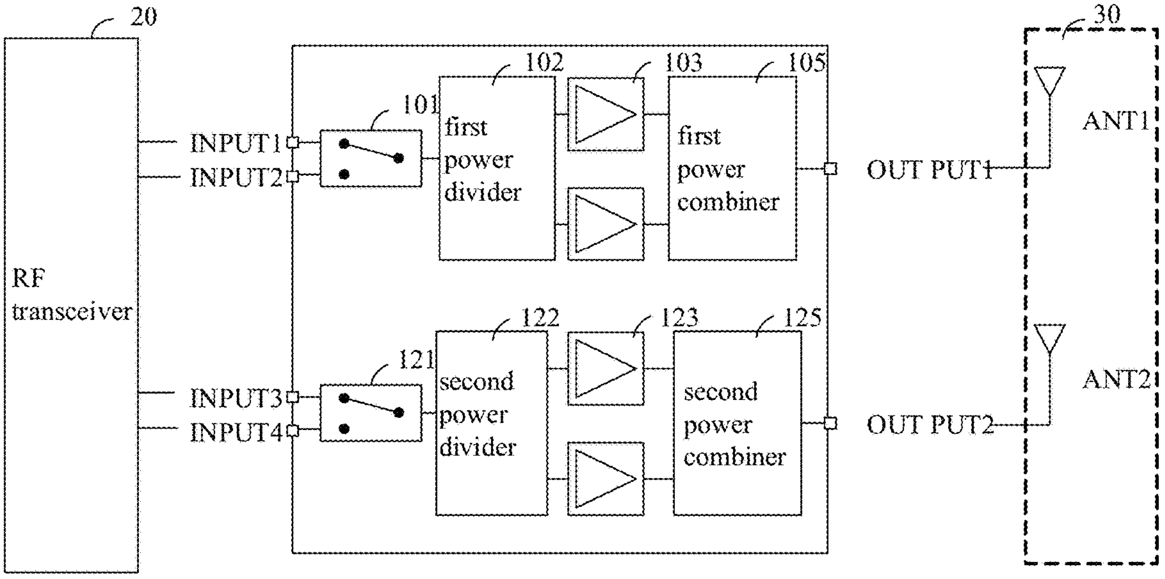
FIG. 12 second is a structural schematic view of a RF system according to an embodiment of the present disclosure.
Figure 13:
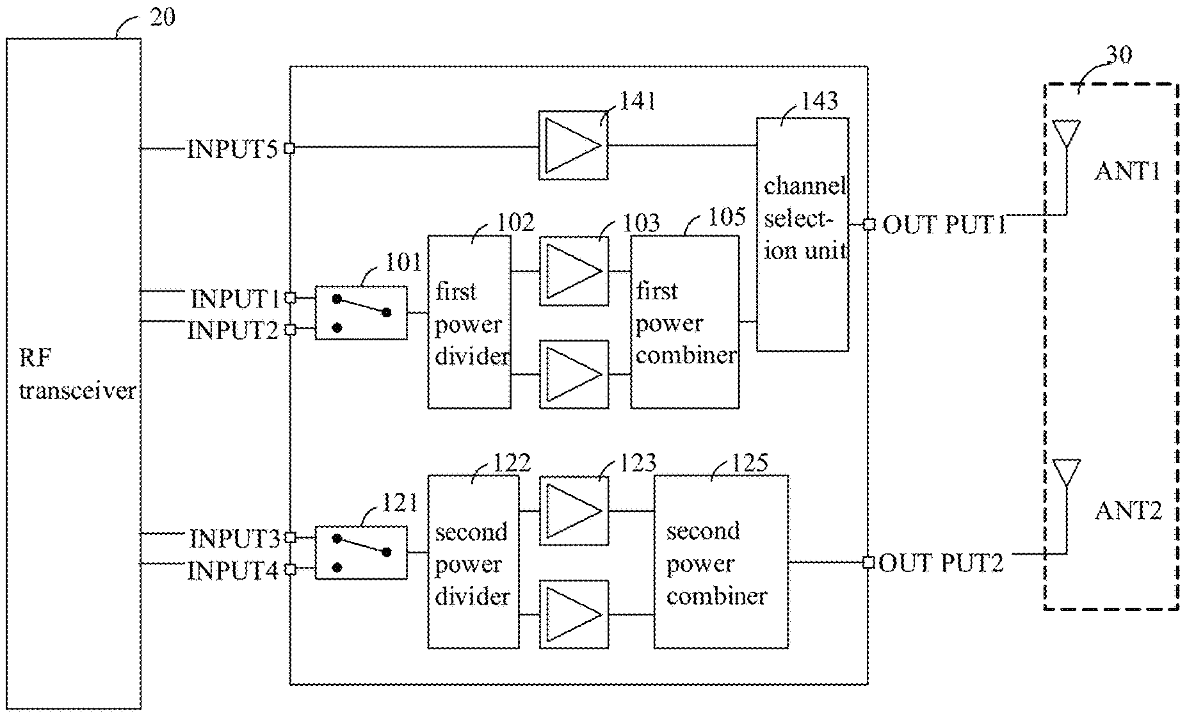
FIG. 13 is third a structural schematic view of the RF system according to an embodiment of the present disclosure.

In some embodiments of the present disclosure, a RF front-end circuit may be further provided. In an embodiment, as shown in FIGS. 11-13, the RF system may include a RF transceiver 20, the RF PA Mid device 10 of any of the above embodiments and an antenna set 30. Each input port of the RF PA Mid device 10 may be correspondingly connected to the RF transceiver 20 and may be configured to receive the RF signals of the different modes and the different frequency bands sent by the RF transceiver 20, such as the low-frequency signal and the high-frequency signal of the first mode, and the low-frequency signal, the intermediate-frequency signal, and the high-frequency signal of the second mode. The signals received by different output ports are different from each other, which may be referred to the description of relevant embodiments in the above, and will not be repeated here.

The antenna set 30 may include at least one antenna, and the antenna may correspondingly support transmission and reception of signals in different frequency bands. As shown in FIG. 11, in some embodiments, if the RF PA Mid device 10 of the RF system is only arranged with one antenna port, such as the first antenna port OUTPUT1, the antenna set 30 may include one antenna, such as the first antenna ANT1, and the first antenna ANT1 may be configured to support reception and transmission of the intermediate-frequency signal and the high-frequency signal (which may include the intermediate-frequency signal and the high-frequency signal of the first mode, and the intermediate-frequency signal and the high-frequency signal of the second mode).

As shown in FIG. 12 and FIG. 13, if the RF PA Mid device 10 of the RF system is only arranged with two antenna ports, such as the first antenna port OUTPUT1 and the second antenna port OUTPUT2, the antenna set 30 may include the first antenna ANT1 and the second antenna ANT2. The first antenna ANT1 is connected to the first antenna port OUTPUT1 and may be configured to support reception and transmission of the intermediate-frequency signal and the high-frequency signal. The second antenna ANT2 is connected to the second antenna port OUTPUT2 and may be configured to support reception and transmission of the low-frequency signals (which may include the low-frequency signal of the first mode and the low-frequency signal of the second mode).

In some embodiments, each antenna of the antenna set 30 may be a directional antenna or a non-directional antenna. Exemplarily, each antenna may be formed by means of using any suitable type of antenna. For example, each antenna may include an antenna with a resonant element formed by at least one of the following antenna structures: an array antenna structure, a ring antenna structure, a patch antenna structure, a slot antenna structure, a spiral antenna structure, a strip antenna, a monopole antenna, a dipole antennas, etc.

In the above-mentioned RF system of the above-mentioned embodiments, by arranging the first switch 101, the first power combiner 105, and the plurality of first power amplifiers 103, the first power combiner 105 may perform combining processing on the output power of the RF signal (for example, the high-frequency signal of the first mode or the intermediate-frequency signal of the second mode) output by the plurality of first power amplifiers 103. In this way, the power value of the RF signal output to the first antenna port OUTPUT may meet the target power of the communication standard, thereby enabling the RF PA Mid device to have the function of supporting transmission of the 2G GSM high-frequency signal and the 4G LTE intermediate-frequency signal. Furthermore, it is possible to reduce the case that the plurality of independent RF transmission modules are arranged to support transmission control of the high-frequency signal of the first mode, and the intermediate-frequency signal and the high-frequency signal of the second mode in the related art, thereby improving the integration of the RF PA Mid device, reducing the length of the RF wiring, reducing the loss on the transmission path, and improving the transmission power of the RF signal. In addition, the space occupied by the RF system may be reduced.

In some embodiments, based on the RF system shown in FIG. 12, a simulation testing may be conducted on the RF system, and a test result is shown in Table 3.

TABLE 3

Comparison of Simulation Test Result for RF Performance

| Communication mode | | | Transmitting power | Working current |
|---|---|---|---|---|
| 2G | Related art | Low-frequency band (LB) | 33 dBm | 2400 mA |
| | | High-frequency band (HB) | 30 dBm | 1950 mA |
| | Embodiments of the present disclosure | Low-frequency band (LB) | 34 dBm | 2360 mA |
| | | High-frequency band (HB) | 31.2 dBm | 1964 mA |

As shown in Table 3, by using the RF PA Mid device 10 shown in FIG. 6, the transmission power of the GSM low-frequency signal may be increased by 1 dB, thereby greatly improving a communication distance of the GSM low-frequency signal. At the same time, a working current is further reduced by 40 mA, thereby reducing power consumption and delaying a standby time of the RF system. The transmission power of the GSM high-frequency signal may be increased by 1.2 dB, thereby greatly improving a communication distance of the GSM high-frequency signal. A power consumption current slightly increases, whose impact on the power consumption may be ignored, and thus the standby time of the RF system cannot be affected.

Figure 14:
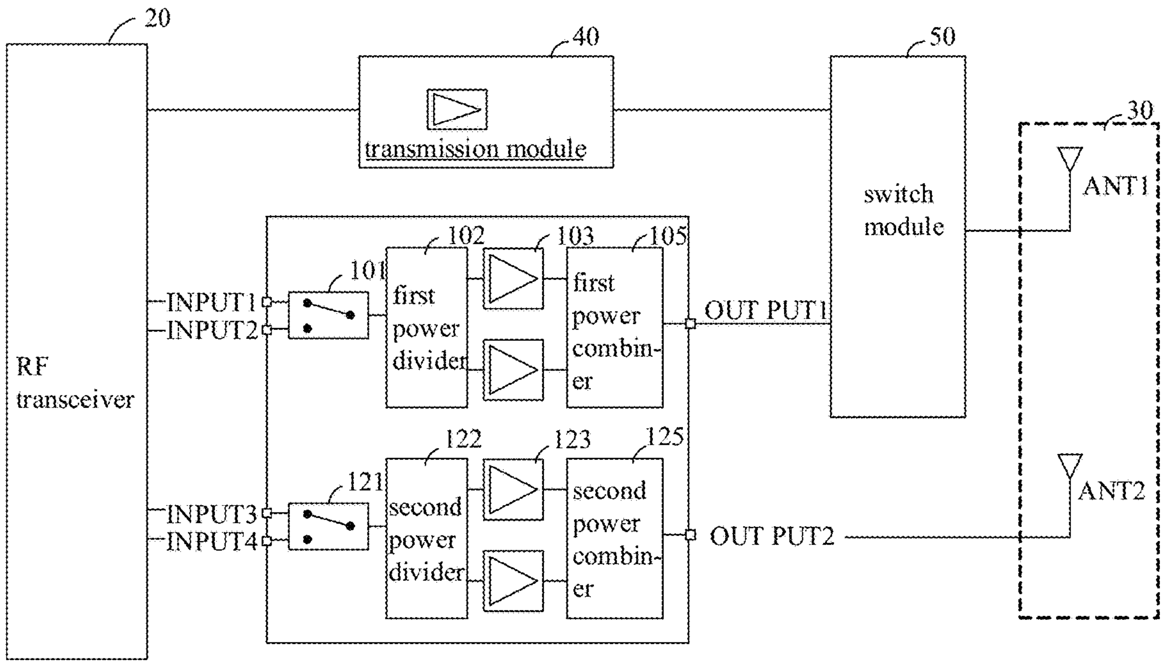
FIG. 14 is a fourth structural schematic view of the RF system according to an embodiment of the present disclosure.

In some embodiments of the present disclosure, a radio frequency system may be further provided. As shown in FIG. 14, in an embodiment, the RF system may include a RF transceiver 20, an antenna set 30, a transmission module 40, a switch module 50, and the above-mentioned RF PA Mid device 10 (such as the RF PA Mid device 10 shown in FIGS. 1, 4-6, and 9).

In some embodiments, the transmission module 40 is connected to the RF transceiver 20 and configured to support transmission and amplification processing of the high-frequency signal of the second mode. The transmission module 40 may be a PA Mid device with a built-in power amplifier. In some embodiments, the transmission module 40 may support transmission processing of the 4G LTE high-frequency signal.

Two first ends of the switch module 50 are respectively connected with the first antenna port OUTPUT1 of the RF PA Mid device 10 and the transmission module 40 in one-to-one correspondence. A second end of the switch module 50 is connected with the antenna set 30, and the switch module 50 is configured to selectively output the intermediate-frequency signal of the first mode or the intermediate-frequency signal and the high-frequency signal of the second mode to the first antenna ANT1 of the antenna set 30.

In the above-mentioned RF system, by arranging the RF PA Mid device 10, the power value of the RF signal output by the RF PA Mid device 10 may meet the target power of the communication standard, thereby enabling the RF PA Mid device 10 to have at least the function of supporting transmission processing of the 2G GSM high-frequency signal and the 4G LTE intermediate-frequency signal. In this way, it is possible to reduce the case that the plurality of independent RF transmission modules are arranged to support transmission control of the high-frequency signal of the first mode, and the intermediate-frequency signal and the high-frequency signal of the second mode in the related art, thereby improving the integration of the RF PA Mid device, reducing the length of the RF wiring, reducing the loss on the transmission path, and improving the transmission power of the RF signal. In addition, the space occupied by the RF system may be reduced, and the RF system may further achieve the transmission processing function of the 4G LTE high-frequency signal.

Figure 15:
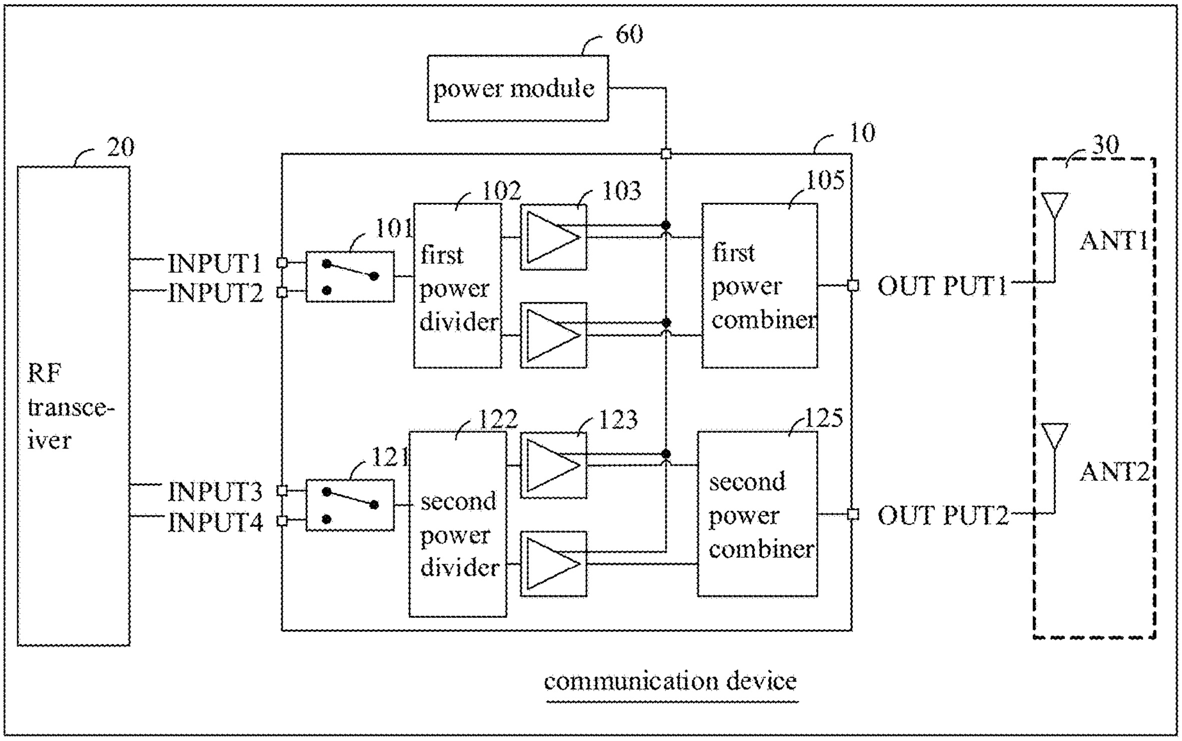
FIG. 15 is a structural schematic view of a communication device according to an embodiment of the present disclosure.

In some embodiments of the present disclosure, a communication device may be further provided. In an embodiment, as shown in FIG. 15, the communication device may include a power module and the RF system of any of the above-mentioned embodiments. The power module 60 is connected with the RF system and may be configured to provide power voltage for each power amplifier of the RF system. The power module 60 includes a fixed voltage source or an adjustable voltage source. In some embodiments, the stability and reliability of the voltage output by the power module 60 may be improved by means of the fixed voltage source, and the flexibility of the voltage output by the power module 60 may be improved by means of the adjustable voltage source. Therefore, the power module 60 may be selected in an appropriate form according to actual needs to achieve a better RF performance. It should be noted that a hardware structure of the adjustable voltage source is not limited by the embodiments, for example, the adjustable voltage source arranged with a varistor voltage divider may be used.

The power value of the RF signal output by the above-mentioned communication device may meet the target power of the communication standard, thereby enabling the communication device to have at least the function of supporting transmission processing of the 2G GSM high-frequency signal and the 4G LTE intermediate-frequency signal. At the same time, by arranging the RF PA Mid device 10, it is possible to reduce the case that the plurality of independent RF transmission modules are arranged to support transmission control of the high-frequency signal of the first mode, and the intermediate-frequency signal and the high-frequency signal of the second mode in the related art, thereby improving the integration of the RF PA Mid device, reducing the length of the RF wiring, reducing the loss on the transmission path, and improving the transmission power of the RF signal. In addition, the space occupied by the RF system may be reduced.

The technical features of the above-mentioned embodiments can be combined arbitrarily. In order to make the description concise, all possible combinations of the various technical features in the above-mentioned embodiments are not described. However, as long as there is no contradiction in the combination of these technical features, all should be considered within the scope of this specification.

The above-mentioned embodiments only express several implementation modes of the present disclosure, and the description is relatively specific and detailed, but it should not be understood as a limitation on the scope of the present disclosure. It should be noted that for those skilled in the art, without departing from the concept of the present disclosure, several modifications and improvements can be made, and these all fall within the scope of the present disclosure. Therefore, the scope of the present disclosure should be subject to the appended claims.

What is claimed is:

1. A radio frequency (RF) power amplifier module integrated duplexer (PA Mid) device, arranged with a first input port configured to receive a high-frequency signal of a first mode sent by a RF transceiver, a second input port configured to receive an intermediate-frequency signal of a second mode sent by the same RF transceiver, a first antenna port configured to connect an antenna, a second antenna port, a third input port configured to receive a low-frequency signal of the first mode, and a fourth input port configured to receive a low-frequency signal of the second mode, wherein the RF PA Mid device comprises:

a first switch, comprising two first ends and a second end, wherein the two first ends of the first switch are respectively connected with the first input port and the second input port in one-to-one correspondence, and the first switch is configured to selectively output the high-frequency signal of the first mode or the intermediate-frequency signal of the second mode;

a plurality of first power amplifiers, wherein each of the plurality of first power amplifiers comprises an input end and an output end, the input end of each of the plurality of first power amplifiers is connected with the second end of the first switch respectively, and each of the plurality of first power amplifiers is configured to support amplification processing of the high-frequency signal and the intermediate-frequency signal; and a first power combiner, comprising a plurality of input ends and an output end, wherein the plurality of input ends of the first power combiner are respectively connected with the output ends of the plurality of first power amplifiers in one-to-one correspondence, the output end of the first power combiner is connected with the first antenna port, and the first power combiner is configured to combine output powers of the plurality of first power amplifiers to output an intermediate-frequency signal with target power or a high-frequency signal with target power;

a second switch, comprising two first ends and a second end, wherein the two first ends of the second switch are respectively connected with the third input port and the fourth input port in one-to-one correspondence, and the second switch is configured to selectively output the low-frequency signal of the first mode and the low-frequency signal of the second mode;

a plurality of second power amplifiers, wherein each of the plurality of second power amplifiers comprises an input end and an output end, the input end of each of the plurality of second power amplifiers is connected with the second end of the second switch, and each of the plurality of second power amplifiers is configured to support amplification processing of the low-frequency signal; and a second power combiner, comprising a plurality of input ends and an output end, wherein the plurality of input ends of the second power combiner are respectively connected with the output ends of the plurality of second power amplifiers in one-to-one correspondence, the output end of the second power combiner is connected with the second antenna port, and the second power combiner is configured to combine output powers of the plurality of second power amplifiers to output a low-frequency signal with target power.

2. The RF PA Mid device according to claim 1, further comprising:

a first power divider, comprising an input end and a plurality of output ends, wherein the input end of the first power divider is connected with the second end of the first switch, the plurality of output ends of the first power divider are respectively connected with the input ends of the plurality of first power amplifiers in one-to-one correspondence, and the first power divider is configured to perform power allocation processing on the high-frequency signal of the first mode and the intermediate-frequency signal of the second mode.

3. The RF PA Mid device according to claim 2, wherein the number of the plurality of first power amplifiers is two.

4. The RF PA Mid device according to claim 1, further comprising:

a second power divider, comprising an input end and a plurality of output ends, wherein the input end of the second power divider is connected with the second end of the second switch, the plurality of output ends of the second power divider are respectively connected with the input ends of the plurality of second power amplifiers in one-to-one correspondence, and the second power divider is configured to perform power allocation processing on the low-frequency signal.

5. The RF PA Mid device according to claim 1, wherein the number of the plurality of second power amplifiers is two.

6. The RF PA Mid device according to claim 1, further arranged with a fifth input port, wherein the RF PA Mid device further comprises:

a third power amplifier, comprising an input end and an output end, wherein the input end of the third power amplifier is connected to the fifth input port, and the third power amplifier is configured to perform amplification processing on the received high-frequency signal of the second mode; and a channel selection unit, comprising two first ends and a second end, wherein the two first ends of the channel selection unit are respectively connected with the output end of the first power combiner and the output end of the third power amplifier in one-to-one correspondence, the second end of the channel selection unit is connected with the first antenna port, and the channel selection unit is configured to selectively output the intermediate-frequency signal of the first mode or the intermediate-frequency signal and the high-frequency signal of the second mode to the first antenna port.

7. The RF PA Mid device according to claim 6, wherein the channel selection unit comprises a single-pole double-throw switch.

8. The RF PA Mid device according to claim 6, wherein the channel selection unit comprises a combiner.

9. The RF PA Mid device according to claim 1, wherein the RF PA Mid device is further arranged with a power port, the power port is connected with a power supply terminal of each of the power amplifiers, respectively, and the power port is configured to receive a power supply voltage in a range from 4.2V to 6V.

10. A radio frequency (RF) system, comprising:

a RF transceiver;

a RF power amplifier module integrated duplexer (PA Mid) device, connected with the RF transceiver;

wherein the RF PA Mid device is arranged with a first input port configured to receive a high-frequency signal of a first mode sent by the RF transceiver, a second input port configured to receive an intermediate-frequency signal of a second mode sent by the same RF transceiver, a first antenna port configured to connect an antenna, a second antenna port, a third input port configured to receive a low-frequency signal of the first mode, and a fourth input port configured to receive a low-frequency signal of the second mode; and the RF PA Mid device comprises:

a first switch, comprising two first ends and a second end, wherein the two first ends of the first switch are respectively connected with the first input port and the second input port in one-to-one correspondence, and the first switch is configured to selectively output the high-frequency signal of the first mode or the intermediate-frequency signal of the second mode;

a plurality of first power amplifiers, wherein each of the plurality of first power amplifiers comprises an input end and an output end, the input end of each of the plurality of first power amplifiers is connected with the second end of the first switch respectively, and each of the plurality of first power amplifiers is configured to support amplification processing of the high-frequency signal and the intermediate-frequency signal; and a first power combiner, comprising a plurality of input ends and an output end, wherein the plurality of input ends of the first power combiner are respectively connected with the output ends of the plurality of first power amplifiers in one-to-one correspondence, the output end of the first power combiner is connected with the first antenna port, and the first power combiner is configured to combine output powers of the plurality of first power amplifiers to output an intermediate-frequency signal with target power or a high-frequency signal with target power;

a second switch, comprising two first ends and a second end, wherein the two first ends of the second switch are respectively connected with the third input port and the fourth input port in one-to-one correspondence, and the second switch is configured to selectively output the low-frequency signal of the first mode and the low-frequency signal of the second mode;

a plurality of second power amplifiers, wherein each of the plurality of second power amplifiers comprises an input end and an output end, the input end of each of the plurality of second power amplifiers is connected with the second end of the second switch, and each of the plurality of second power amplifiers is configured to support amplification processing of the low-frequency signal; and a second power combiner, comprising a plurality of input ends and an output end, wherein the plurality of input ends of the second power combiner are respectively connected with the output ends of the plurality of second power amplifiers in one-to-one correspondence, the output end of the second power combiner is connected with the second antenna port, and the second power combiner is configured to combine output powers of the plurality of second power amplifiers to output a low-frequency signal with target power; and an antenna set, connected to the antenna port of the RF PA Mid device and configured to transmit and receive a RF signal.

11. The RF system according to claim 10, wherein the RF PA Mid device comprises one antenna port, and the antenna set comprises a first antenna connected with the antenna port.

12. The RF system according to claim 10, wherein the RF PA Mid device comprises two antenna ports, the antenna set comprises a first antenna and a second antenna, and the first antenna and the second antenna are respectively connected with the two antenna ports in one-to-one correspondence.

13. The RF system according to claim 10, wherein the RF PA Mid device further comprises:

a first power divider, comprising an input end and a plurality of output ends, wherein the input end of the first power divider is connected with the second end of the first switch, the plurality of output ends of the first power divider are respectively connected with the input ends of the plurality of first power amplifiers in one-to-one correspondence, and the first power divider is configured to perform power allocation processing on the high-frequency signal of the first mode and the intermediate-frequency signal of the second mode.

14. The RF system according to claim 10, wherein the RF PA Mid device is further arranged with a second antenna port, a third input port configured to receive a low-frequency signal of the first mode, and a fourth input port configured to receive a low-frequency signal of the second mode;

wherein the RF PA Mid device further comprises:

a second switch, comprising two first ends and a second end, wherein the two first ends of the second switch are respectively connected with the third input port and the fourth input port in one-to-one correspondence, and the second switch is configured to selectively output the low-frequency signal of the first mode and the low-frequency signal of the second mode;

a plurality of second power amplifiers, wherein each of the plurality of second power amplifiers comprises an input end and an output end, the input end of each of the plurality of second power amplifiers is connected with the second end of the second switch, and each of the plurality of second power amplifiers is configured to support amplification processing of the low-frequency signal; and a second power combiner, comprising a plurality of input ends and an output end, wherein the plurality of input ends of the second power combiner are respectively connected with the output ends of the plurality of second power amplifiers in one-to-one correspondence, the output end of the second power combiner is connected with the second antenna port, and the second power combiner is configured to combine output powers of the plurality of second power amplifiers to output a low-frequency signal with target power.

15. The RF system according to claim 14, wherein the RF PA Mid device further comprises:

a second power divider, comprising an input end and a plurality of output ends, wherein the input end of the second power divider is connected with the second end of the second switch, the plurality of output ends of the second power divider are respectively connected with the input ends of the plurality of second power amplifiers in one-to-one correspondence, and the second power divider is configured to perform power allocation processing on the low-frequency signal.

16. The RF system according to claim 10, wherein the RF PA Mid device is further arranged with a fifth input port and further comprises:

a third power amplifier, comprising an input end and an output end, wherein the input end of the third power amplifier is connected to the fifth input port, and the third power amplifier is configured to perform amplification processing on the received high-frequency signal of the second mode; and a channel selection unit, comprising two first ends and a second end, wherein the two first ends of the channel selection unit are respectively connected with the output end of the first power combiner and the output end of the third power amplifier in one-to-one correspondence, the second end of the channel selection unit is connected with the first antenna port, and the channel selection unit is configured to selectively output the intermediate-frequency signal of the first mode or the intermediate-frequency signal and the high-frequency signal of the second mode to the first antenna port.

17. A communication device, comprising:

a radio frequency (RF) system, wherein the RF system comprises:

a RF transceiver;

a RF power amplifier module integrated duplexer (PA Mid) device, connected with the RF transceiver; and an antenna set, connected to the antenna port of the RF PA Mid device and configured to transmit and receive a RF signal;

wherein the RF PA Mid device is arranged with a first input port configured to receive a high-frequency signal of a first mode sent by the RF transceiver, a second input port configured to receive an intermediate-frequency signal of a second mode sent by the same RF transceiver, a first antenna port configured to connect an antenna, a second antenna port, a third input port configured to receive a low-frequency signal of the first mode, and a fourth input port configured to receive a low-frequency signal of the second mode; and the RF PA Mid device comprises:

a first switch, comprising two first ends and a second end, wherein the two first ends of the first switch are respectively connected with the first input port and the second input port in one-to-one correspondence, and the first switch is configured to selectively output the high-frequency signal of the first mode or the intermediate-frequency signal of the second mode;

a plurality of first power amplifiers, wherein each of the plurality of first power amplifiers comprises an input end and an output end, the input end of each of the plurality of first power amplifiers is connected with the second end of the first switch respectively, and each of the plurality of first power amplifiers is configured to support amplification processing of the high-frequency signal and the intermediate-frequency signal; and a first power combiner, comprising a plurality of input ends and an output end, wherein the plurality of input ends of the first power combiner are respectively connected with the output ends of the plurality of first power amplifiers in one-to-one correspondence, the output end of the first power combiner is connected with the first antenna port, and the first power combiner is configured to combine output powers of the plurality of first power amplifiers to output an intermediate-frequency signal with target power or a high-frequency signal with target power;

a second switch, comprising two first ends and a second end, wherein the two first ends of the second switch are respectively connected with the third input port and the fourth input port in one-to-one correspondence, and the second switch is configured to selectively output the low-frequency signal of the first mode and the low-frequency signal of the second mode;

a plurality of second power amplifiers, wherein each of the plurality of second power amplifiers comprises an input end and an output end, the input end of each of the plurality of second power amplifiers is connected with the second end of the second switch, and each of the plurality of second power amplifiers is configured to support amplification processing of the low-frequency signal; and a second power combiner, comprising a plurality of input ends and an output end, wherein the plurality of input ends of the second power combiner are respectively connected with the output ends of the plurality of second power amplifiers in one-to-one correspondence, the output end of the second power combiner is connected with the second antenna port, and the second power combiner is configured to combine output powers of the plurality of second power amplifiers to output a low-frequency signal with target power; and a power module, connected with the RF PA Mid device and configured to provide a power voltage for the RF PA Mid device.

18. The communication device of claim 17, wherein the power module comprises a fixed voltage source or an adjustable voltage source.

* * * * *